(12) United States Patent
Hara et al.

(10) Patent No.: US 7,939,768 B2
(45) Date of Patent: May 10, 2011

(54) CRYSTAL UNIT

(75) Inventors: Kouichi Hara, Saitama (JP); Shigeru Obara, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 271 days.

(21) Appl. No.: 12/383,880

(22) Filed: Mar. 30, 2009

(65) Prior Publication Data
US 2009/0252983 A1  Oct. 8, 2009

(30) Foreign Application Priority Data

Apr. 2, 2008 (JP) ................. 2008-095800

(51) Int. Cl.
*H01L 23/02* (2006.01)
*H05K 5/06* (2006.01)
(52) U.S. Cl. ......... 174/564; 310/344; 310/348; 310/369
(58) Field of Classification Search .......... 174/564; 310/344, 348, 369
See application file for complete search history.

(56) References Cited

U.S. PATENT DOCUMENTS

| 3,872,331 | A | * | 3/1975 | Falco ........................ 310/313 B |
| 4,152,616 | A | * | 5/1979 | Ozbirn et al. ................. 310/344 |
| 4,431,937 | A | * | 2/1984 | White ............................ 310/344 |
| 4,453,104 | A | * | 6/1984 | Rapps et al. ................... 310/348 |
| 4,686,324 | A | * | 8/1987 | Debaisieux et al. ........ 174/17.05 |
| 5,235,135 | A | * | 8/1993 | Knecht et al. ................. 174/539 |
| 5,438,305 | A | * | 8/1995 | Hikita et al. ..................... 333/32 |
| 5,635,672 | A | * | 6/1997 | Kawaura ........................ 174/564 |
| 6,489,558 | B1 | * | 12/2002 | Baba et al. ..................... 174/523 |
| 2005/0269912 | A1 | | 12/2005 | Iwasaki et al. |

FOREIGN PATENT DOCUMENTS

| JP | 62-164417 U | 10/1987 |
| JP | 3-121609 A | 5/1991 |
| JP | 3-90125 U | 9/1991 |
| JP | 2005-348082 (A) | 12/2005 |

* cited by examiner

*Primary Examiner* — Hung V Ngo
(74) *Attorney, Agent, or Firm* — Carrier Blackman & Associates, P.C.; Joseph P. Carrier; William D. Blackman

(57) ABSTRACT

A crystal unit includes a unit base in which a metal flange is welded to an outer circumference of a base main body, a crystal element held by supporters on the unit base, and a metal cover that is jointed to the metal flange to cover and hermetically encapsulate the crystal element. The base main body is formed of ceramic. A first metal film, to which the metal flange is joined, is formed on a surface of the outer circumference of the base main body. At least two places of the main body, second metal films are formed on an inner bottom face of the main body, and third metal films are formed on an outer bottom face of the main body. The second metal films and the third metal films are electrically connected to one another through via holes. The supporters are joined to the second metal films.

3 Claims, 4 Drawing Sheets

CRYSTAL UNIT

This application claims priority from Japanese Patent Application No. 2008-095800 filed on Apr. 2, 2008, the entire subject matter of which is incorporated herein by reference.

BACKGROUND OF THE INVENTION

1. Field of the Invention

The invention relates to a technical field of a highly-stabilized crystal unit by resistance welding or cold welding, and in particular, to a crystal unit whose unit base is formed of ceramic.

2. Description of the Related Art

A highly-stabilized crystal unit is generally used as a crystal unit of a constant-temperature type using a heater, and is free of the influence of an environmental temperature. Therefore, the crystal unit is capable of precisely maintaining frequency stability (for example, 10 ppb or less) thereof, and is incorporated in an oscillator for a base station among communication devices. As one of these crystal units, there has been proposed a crystal unit whose crystal element is horizontally held with respect to a metal base thereof (see, for example, JP-A-2005-348082).

FIGS. 3A to 3C are diagrams for explanation of one example of a related art crystal unit. FIG. 3A is a plan view of the related art crystal unit except for a cover thereof, FIG. 3B is a cross-sectional view taken along the line O-A in FIG. 3A, and FIG. 3C is an enlarged cross-sectional view of a part shown by O-shaped dotted line in FIG. 3B.

The related art crystal unit 200 is configured such that a crystal element 1 formed into, for example, a circular disk shape is held on a metal base 2, and is covered with a metal cover 3 so as to hermetically encapsulate the crystal element 1. The crystal element 1 is formed into a circular disk shape as an AT-cut crystal element, and has excitation electrodes 4 (4a and 4b) on the both principal surfaces thereof, and leading electrodes 5 (5a and 5b) are extended so as to include end faces at two places of the outer circumferential part at intervals at an angle of 120 degrees. The AT-cut crystal element has the principal surfaces which are planar surfaces formed by the X-axis and the Z'-axis of the axes (XY'Z') newly formed by a rotation centering on the X-axis of the crystal axes (XYZ).

The metal base 2 has a metal flange 2b going around the outer circumference of a base main body 2a. The base main body 2a is formed of kovar consisting primarily of Fe so as to contain Ni and Co, and has lead wires 7 (so-called hermetic terminals) which are three in total, and are evenly arrayed at intervals at every angle of 120 degrees so as to be insulated to penetrate through the metal base 2 by glasses 6. The lead wire 7 has a nail-headed part 7a, that projects from the principal surface of the base main body 2a. Then, the glass 6 climbs the lead wire 7 through the both principal surfaces. A horizontal part of an L-shaped supporter 8 having a shoulder is connected to the nail-headed part 7a by spot welding. The metal flange 2b is formed into a crank shape in a cross-sectional view, and a horizontal part at one side thereof is welded onto the outer circumference of the base main body 2a.

Then, the principal surface of the crystal element 1 is horizontally kept with respect to the metal base 2, and the three places of the two outer circumferential parts of the leading electrodes 5 (5a and 5b) which are extended and the outer circumferential part separated away from those at 120 degrees are held by the shoulders of the supporters 8 by electrically conductive adhesive (not shown). Then, the metal cover 3 formed into a concave shape of kovar and having a flange is connected to the other horizontal part of the metal flange 2b of the metal base 2 by cold welding or resistance welding.

The related art crystal unit 200 is mounted on a set substrate along with circuit elements composing an oscillator circuit and other elements. Then, the related art crystal unit 200 is mainly maintained at a constant temperature by a heater structure (not shown), to make a vibrational frequency stable to be, for example, 1 ppb (parts per billion) or less. Then, the set substrate is housed in a cassette to be set into a communication facility for a base station.

However, in the crystal unit having the above-described configuration, the metal base 2 has the base main body 2a formed of kovar, and the lead wires 7 whose nail-headed parts 7a project from the one principal surface. The lead wires 7 project from the one principal surface in order to ensure airtightness by the glasses 6, where the nail-headed parts 7a to which the supporters 8 are connected project. Thereby, the height of the base main body 2a of the metal base 2 basically is made higher by a projected vertical length of the lead wires 7, which causes the problem that the crystal unit is made higher. Incidentally, the thickness of the base main body 2a is required to be 1.3 mm in order to ensure airtightness by the glasses 6, and the projected length of the nail-headed parts 7a is set to 0.2 mm, and thus a total height of the base main body 2a and the nail-headed parts 7a becomes 1.5 mm.

SUMMARY OF THE INVENTION

An object of the invention is to provide a highly-stabilized crystal unit whose metal base is made smaller in height to advance miniaturization.

According to a first aspect of the invention, there is provided a crystal unit comprising: a unit base in which a metal flange is welded to an outer circumference of a base main body; a crystal element held by supporters on the unit base; and a metal cover that is jointed to the metal flange to cover and hermetically encapsulate the crystal element, wherein the base main body is formed of ceramic, wherein a first metal film, to which the metal flange is joined, is formed on a surface of the outer circumference of the base main body, wherein, at least two places of the main body, second metal films are formed on an inner bottom face of the main body, and third metal films are formed on an outer bottom face of the main body, wherein the second metal films and the third metal films are electrically connected to one another through via holes, and wherein the supporters are joined to the second metal films.

According to a second aspect of the invention, in the crystal unit, wherein the metal cover is formed into a concave shape having a flange, and is joined to the metal flange of the unit base by cold welding or resistance welding.

According to a third aspect of the invention, in the crystal unit, wherein lead wires are joined to the third metal films.

According to the first aspect of the invention, the base main body is formed of ceramic, and the metal films on the inner bottom face to which the supporters are connected are connected to the metal films on the outer bottom face through the via holes. Accordingly, electrical conduction and airtightness of the crystal unit are maintained by virtue of the via holes. Thus, it may be possible to omit the lead wires projecting from the one principal surface required in the related art crystal unit. Accordingly, the base main body can be made smaller in height.

In addition, because the metal flange is joined to the outer circumference of the base main body (ceramic), for example, in a case in which the base main body including the outer circumference is made flat, the metal flange is increased by a length of the thickness, which makes the metal base higher. However, the thickness of the metal flange is lower than the height at which the crystal element is held, which does not bring about a factor to make the crystal unit higher.

According to the second aspect of the invention, an airtight level is made, for example, greater than or equal to $1 \times 10^{-10}$ Pam$^3$/S, which is excellent in airtightness. Therefore, it is possible to ensure one of the factors for making frequency stability thereof highly stable.

According to the third aspect of the invention, the metal base in which the lead wires are led out of the outer bottom face can be obtained. Incidentally, the metal films on the outer surface may be mounted on the surface as mounting terminals.

BRIEF DESCRIPTION OF THE DRAWINGS

FIG. 1A is a cross-sectional view of the crystal unit, FIG. 1B is a plan view of a base main body of the crystal unit, and FIG. 1C is a plan view of the crystal unit except for a cover thereof;

FIGS. 3A to 3C are diagrams for explanation of a related art crystal unit, in which FIG. 3A is a plan view of the related art crystal unit except for a cover thereof, FIG. 3B is a cross-sectional view taken along the line O-A in FIG. 3A, and FIG. 3C is an enlarged cross-sectional view of a part shown by O-shaped dotted line in FIG. 3B.

DETAILED DESCRIPTION OF THE PREFERRED EMBODIMENTS

Embodiments of the invention will now be described with reference to the drawings.

Figure 1A:
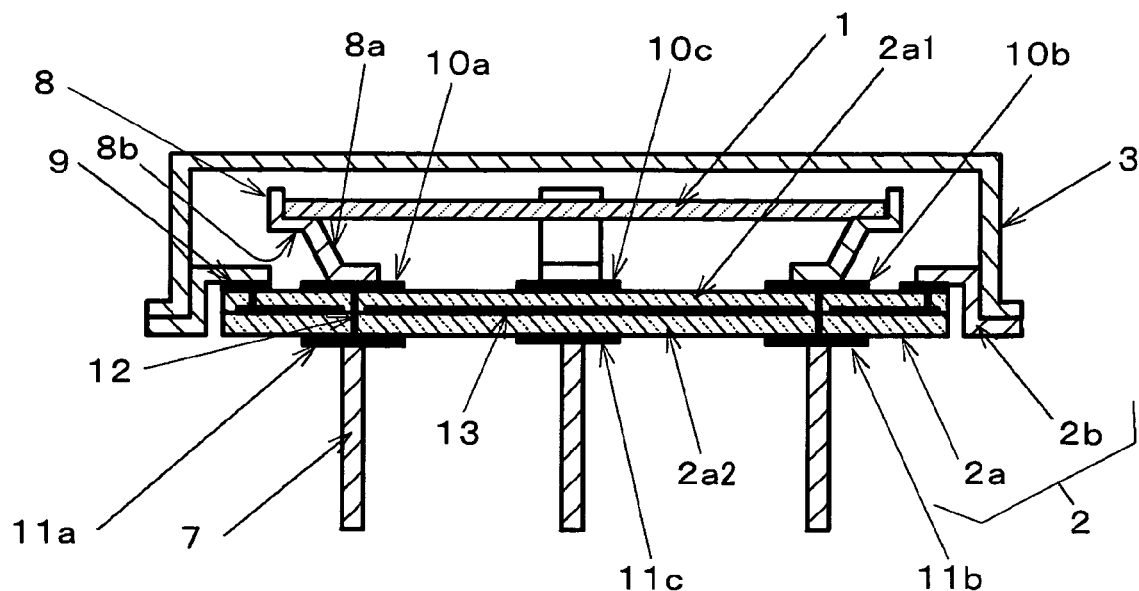
FIGS. 1A to 1C are diagrams for explanation of a crystal unit according to one embodiment of the invention.
Figure 1B:
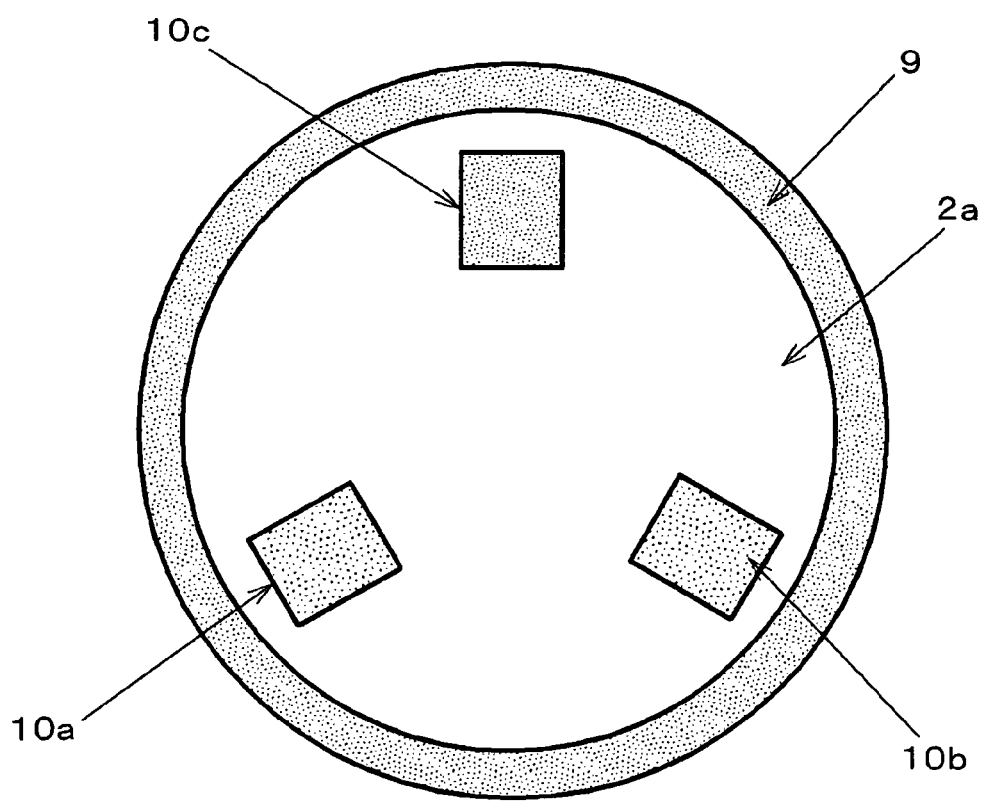
Figure 1C:
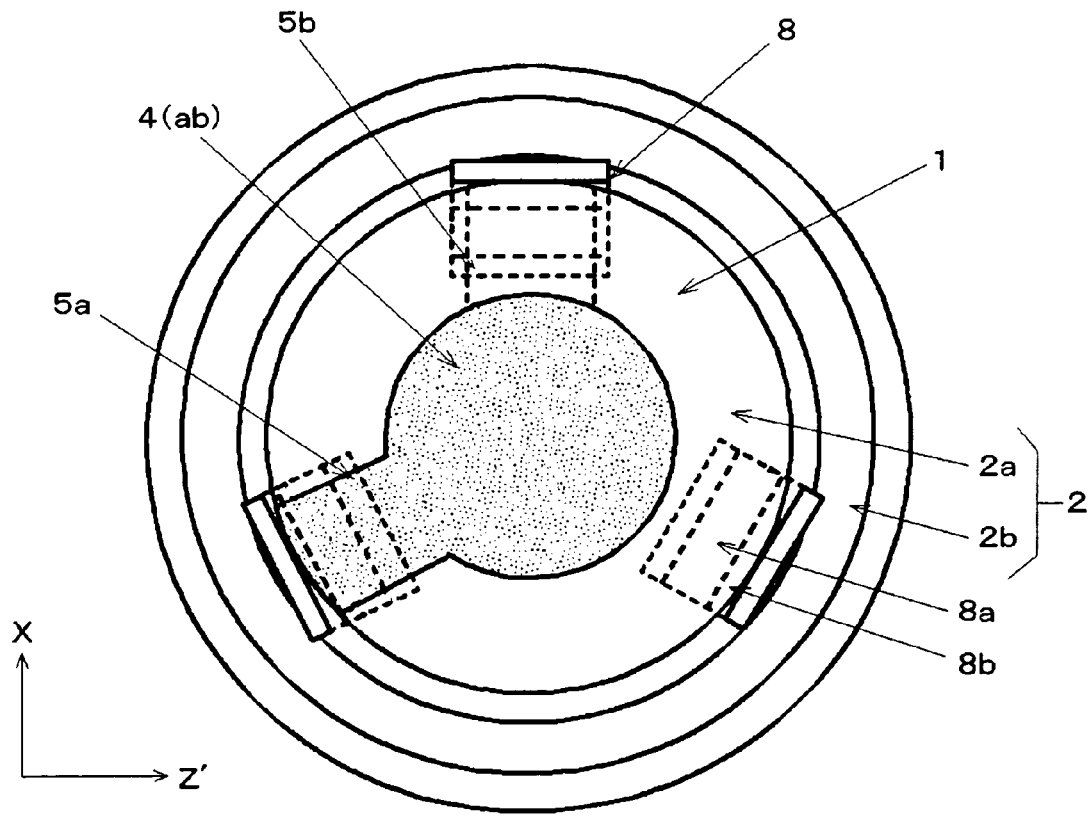

FIGS. 1A to 1C are diagrams for explanation of a crystal unit according to one embodiment of the invention, in which FIG. 1A is a cross-sectional view of a crystal unit, FIG. 1B is a plan view of a base main body of the crystal unit, and FIG. 1C is a plan view of the crystal unit except for a cover thereof. Incidentally, portions which are the same as those in the related art are denoted by the same numbers, and descriptions thereof will be simplified or omitted.

Figure 3A:
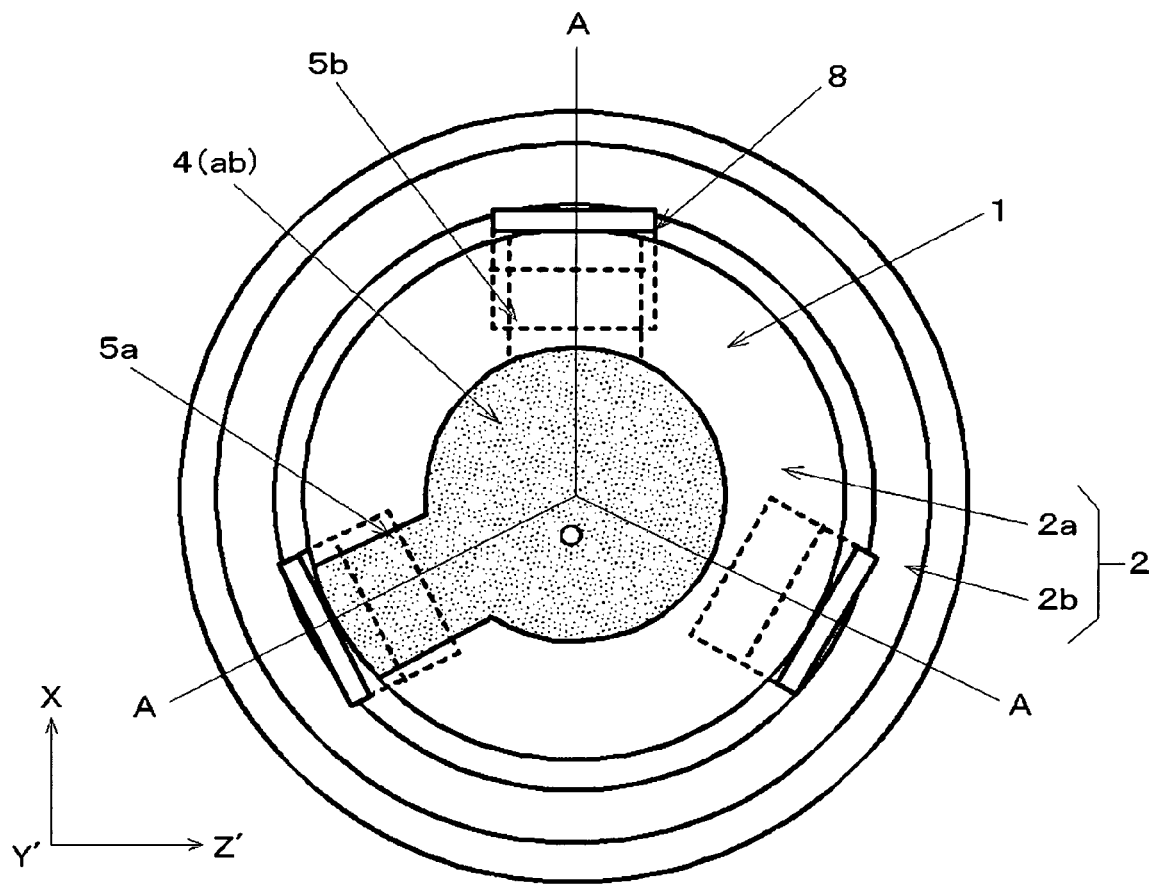
Figure 3B:
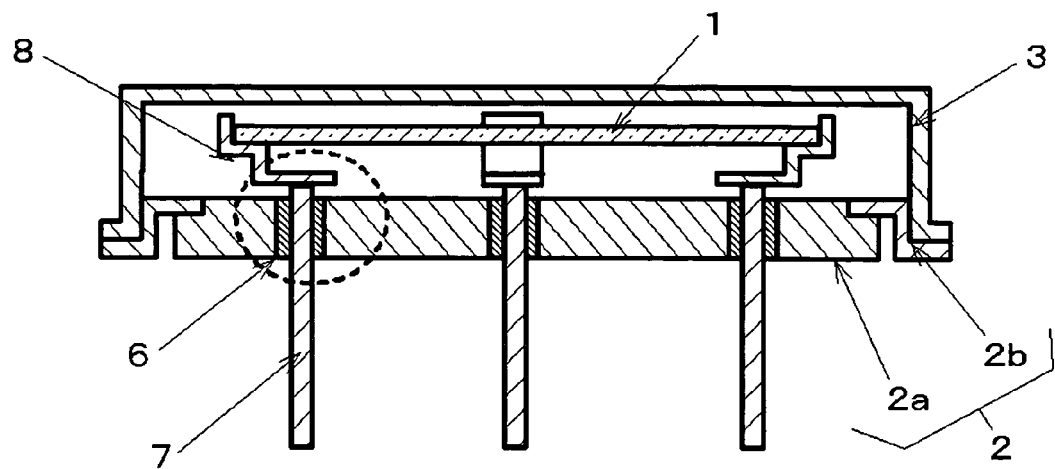
Figure 3C:
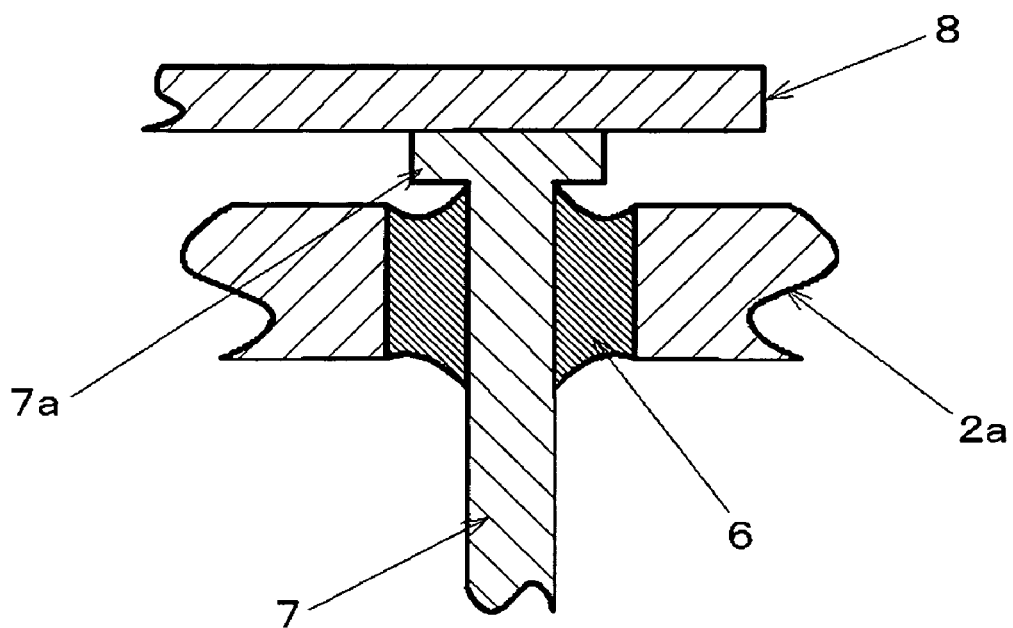

In a crystal unit 100 according to the invention, a crystal element 1 is formed into a circular disk shape as an AT-cut crystal element, and outer circumferential parts thereof arrayed at even intervals at every angle of 120 degrees are held by three supporters 8 provided on an inner bottom face of a unit base 2 (a base main body 2a). Incidentally, leading electrodes 5 (5a and 5b) extend from excitation electrodes 4 (4a and 4b) on the both principal surfaces at two places of the outer circumferential part of the crystal element 1 (refer to FIG. 3). The supporters 8 have inclined parts 8a from the bottom, and have shoulders 8b to hold the three places of the outer circumferential part of the crystal element 1 at their leading end sides. Then, a metal flange 2b provided to the outer circumference of the unit base 2 is joined by cold welding or resistance welding, to hermetically encapsulate the crystal element 1 at a highly-airtight level ($1 \times 10^{-10}$ Pam$^3$/S or less).

In the crystal unit 100, since the crystal element 1 in a circular disk shape is held at three points by the three supporters 8 evenly arrayed at intervals at every angle of 120 degrees, there is little looseness therein, which geometrically brings about the most stable holding. Accordingly, there is little mechanical deformation by an external impact, which maintains a satisfactory vibrational property.

In this embodiment, the base main body 2a of the unit base 2 is formed, for example, of ceramic having a two-layer structure (2a1 and 2a2). Where the first layer and the second layer of the base main body are both 0.5 mm, those add up to 1.0 mm. Then, a first metal film 9 going around the outer circumferential part is provided onto the surface of the outer circumferential part of the base main body 2a, and three second metal films 10 (10a, 10b and 10c) are provided onto the inner bottom faces at intervals at every angle of 120 degrees which are the inside of the first metal film 9. Further, third metal films 11 (11a, 11b and 11c) are provided on the outer bottom faces respectively facing the second metal films 10 (10a, 10b and 10c).

The metal flange 2b formed into a crank shape in a cross-sectional view is welded to the first metal film 9 going around the surface of the outer circumferential part of the base main body 2a in the same way as described above. The bottoms of the respective supporters 8 are brazed onto the second metal films 10 (10a, 10b and 10c) on the inner bottom face. Then, the second metal films 10 (10a and 10b) serving as crystal electrodes electrically connected to the leading electrodes 5 (5a and 5b) of the crystal element 1 are electrically connected to the third metal films 11 (11a and 11b) on the outer bottom face corresponding to the second metal films 10 (10a and 10b) through via holes 12. In addition, airtightness is maintained by virtue of the via holes 12.

These first to third metal films 9, 10 (10a, 10b and 10c), and 11 (11a, 11b and 11c) are formed such that, for example, W (tungsten) is formed by printing on the base main body 2a in a state of ceramic material. Further, the via holes 12 are formed such that through-holes provided in advance are filled with W at the time of printing. Then, after those are burned along with the ceramic material, Ni and Au films and the like are provided on the W by electrolytic plating.

In addition, a screening electrode 13 is provided between the first layer 2a1 and the second layer 2a2 of the base main body 2a, to electrically connect the first metal film 9 connected to a metal cover 3 on the surface of the outer circumferential part and the metal film 11c on the outer bottom face through the via holes. Thereby, the shield structure of the crystal unit is ensured.

Then, three lead wires 7 are connected to the metal films 11 (11a, 11b and 11c) on the outer bottom face by brazing and the like, to form a structure with three terminals at even intervals at every angle of 120 degrees. The two of the three lead wires 7 serve as crystal terminals connected to the leading electrodes 5 (5a and 5b) of the crystal element 1, and the remaining one lead wire 7 serves as a ground terminal connected to the screening electrode 13.

In such a configuration, because the base main body 2a is formed of ceramic, it is possible to lead out the second metal films 10 (10a and 10b) on the inner bottom face serving as crystal electrodes to the metal films 11 (11a and 11b) on the outer bottom face through the via holes 12 while maintaining airtightness. Accordingly, because the lead wires 7 whose leading ends formed as, for example, nail-headed portions project from the one principal surface of the base main body 2a as in the related art are not used, vertical dimension thereof can be made smaller.

Figure 2:
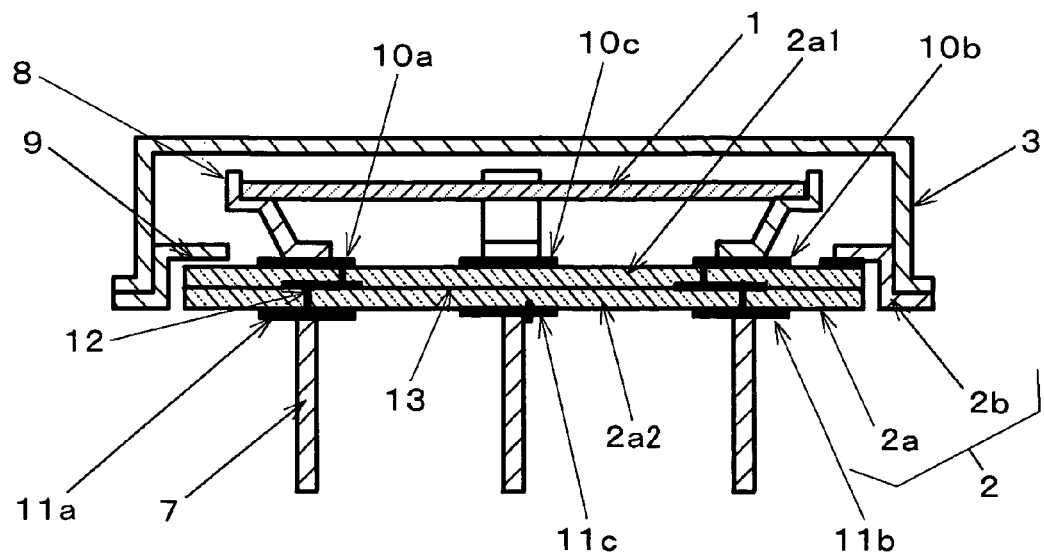
FIG. 2 is a cross-sectional view of a crystal unit according to another embodiment the invention.

In the above-described embodiment, the metal films 10 (10a and 10b) and 11 (11a and 11b) on the inner bottom face and the outer bottom face are connected to one another through the straight via holes 12. Alternatively, as shown in FIG. 2 showing a cross-sectional view of a crystal unit according to another embodiment, the via holes 12 may be formed into crank shapes so as to further ensure air tightness. In addition, the screening electrode 13 is omitted in the drawing.

Further, the base main body 2a is formed into two layers. However, the base main body 2a is not necessarily in two layers, and for example, a single layer can be applied thereto, and vertical dimension thereof can be further made smaller in this case. Then, the crystal element 1 is formed into a circular disk shape as an AT-cut crystal element to be held at the three points. However, the invention can be applied to a case in which the crystal element 1 is formed into, for example, a rectangular shape to be held at two points. Then, in the same way, the invention can be applied to a case in which the crystal element 1 is formed as, not only an AT-cut crystal element, but also, for example, an SC-cut crystal element which is representative as a double rotation Y-cut system, for example, to be held at four points by using arbitrary supporters.

What is claimed is:

1. A crystal unit comprising:
    a unit base in which a metal flange is welded to an outer circumference of a base main body;
    a crystal element held by supporters on the unit base; and
    a metal cover that is jointed to the metal flange to cover and hermetically encapsulate the crystal element,
    wherein the base main body is formed of ceramic,
    wherein a first metal film, to which the metal flange is joined, is formed on a surface of the outer circumference of the base main body,
    wherein, at least two places of the main body, second metal films are formed on an inner bottom face of the main body, and third metal films are formed on an outer bottom face of the main body,
    wherein the second metal films and the third metal films are electrically connected to one another through via holes, and
    wherein the supporters are joined to the second metal films.

2. The crystal unit according to claim 1,
    wherein the metal cover is formed into a concave shape having a flange, and is joined to the metal flange of the unit base by cold welding or resistance welding.

3. The crystal unit according to claim 1,
    wherein lead wires are joined to the third metal films.

* * * * *